United States Patent [19]
Gantley et al.

[11] Patent Number: 4,558,171
[45] Date of Patent: Dec. 10, 1985

[54] HERMETIC ENCLOSURE FOR ELECTRONIC COMPONENTS WITH AN OPTIONALLY TRANSPARENT COVER AND A METHOD OF MAKING THE SAME

[75] Inventors: Francis C. Gantley, Fulton; Jack Chervenic, Liverpool, both of N.Y.; David J. Suconick, Waltham, Mass.

[73] Assignee: General Electric Company, Syracuse, N.Y.

[21] Appl. No.: 660,085

[22] Filed: Oct. 12, 1984

[51] Int. Cl.⁴ .............................................. H01L 23/08
[52] U.S. Cl. .................................. 174/52 FP; 29/588; 357/75
[58] Field of Search ............. 174/52 FP; 29/588, 841; 361/399; 357/74, 75

[56] References Cited
U.S. PATENT DOCUMENTS 4,262,165 4/1981 Ohwaki et al. .................... 357/74 X
4,322,778 3/1982 Barbour et al. .................... 357/74 X Primary Examiner—A. T. Grimley
Assistant Examiner—D. A. Tone
Attorney, Agent, or Firm—Richard V. Lang; Carl W. Baker

[57] ABSTRACT

The present invention deals with an improved hermetic enclosure impervious to moisture, suitable for single or multiple chips. The enclosure is sealable at a low temperature safe for the enclosed electronic components. In particular, the enclosure employs matching direct bond copper surfaces on the substrate and on the cover which may be sealed together with solder. The cover is of a high temperature material which may be transparent. Transparent materials such as fused quartz, or garnet, or sapphire are suitable. The enclosure is economical at both small sizes and relatively large sizes; and the transparent cover material permits for optical signalling into the package.

12 Claims, 3 Drawing Figures

HERMETIC ENCLOSURE FOR ELECTRONIC COMPONENTS WITH AN OPTIONALLY TRANSPARENT COVER AND A METHOD OF MAKING THE SAME

BACKGROUND OF THE INVENTION

1. Field of the Invention

The invention relates to an improved hermetic enclosure for either single or multiple electronic components, including integrated circuit chips, and which includes conduction runs within the enclosure leading to terminals on the exterior of the enclosure. More particularly, the invention relates to a novel hermetic enclosure and to a novel method of making such an enclosure which avoids exposing the components to temperatures that are too high for safety.

2. Description of the Prior Art

Electronics packaging, and more particularly the packaging of single or multiple integrated circuit chips has posed a challenge to the electronic industry. The packaging has had to meet divergent standards. A critical distinction is the imperviousness of the package to moisture penetration. Conventional plastic packages (epoxy, etc.) have been rejected for many critical applications because of their penetrability by moisture. A high quality hermetic package for semiconductor components while not usually maintained in a vacuum, is usually filled with a passivating, inert gas, typically Nitrogen. The passivating property remains high so long as moisture and oxygen levels remain appropriately low. Packaging meeting these requirements has included metal, glass, and ceramics, including alumina, and more recently beryllia. The ceramic materials are formed by a high temperature sintering process (1400° C.), which increases the density of the material over the "green" hot pressed form, and reduces the porosity to the point where it becomes an excellent hermetic, low leakage material.

The packages using ceramic material must usually be assembled at high temperatures from several parts and the construction must also provide for electrical connections passing through the package between enclosed components and external terminals. The processing of the conduction runs is also at a high temperature, well above temperatures which are safe for semiconductors. The lowest of these temperatures is 400°–500° C. for a resinous thick film process, and somewhat higher for a conventional frit process in which a "moly manganese" layer is mixed with glass, and the glass is fused to form a binder of the conductive material to the substrate. The sealing of the package either to other ceramic parts or over thick film processed conduction runs also requires an elevated temperature typically that of a low temperature (~500° C.) glass seal. This temperature is also too high a temperature for safe exposure to semiconductor components.

A need has also developed for a transparent package for either optical inspection or for optical signalling to the enclosed components. Optical coupling is capable of very large bandwidths, and avoids some of the problems present in other high bandwidth connections.

SUMMARY OF THE INVENTION

Accordingly, it is an object of the invention to provide an improved hermetic enclosure for electronic components.

It is another object of the invention to provide an enclosure for electronic components which is impervious to moisture penetration.

It is still another object of the invention to provide a hermetic enclosure for electronic components, the assembly of which does not expose the components to unsafe processing temperatures.

It is a further object of the invention to provide a hermetic enclosure for electronic components which may be unsealed and resealed without injury to the components or to the seal.

It is another object of the invention to provide a hermetic enclosure for electronic components in which a part of the enclosure is transparent.

It is still another object of the invention to provide a method of making a hermetic enclosure which, while using high temperature process steps, avoids exposing the components to unsafe processing temperatures.

These and other objects of the invention are achieved in a novel hermetic enclosure for electronic components, which in one form comprises a substrate, a frame and a cover arranged in a configuration providing headroom for the components.

The substrate provides support for one or more electronic components, and includes a layer of nonporous insulating material capable of withstanding thick film processing and glass sealing temperatures.

The frame, which provides the "headroom", is arranged to surround the electronic components supported on the substrate. The frame is of a non-porous insulating material capable of withstanding the copper-oxygen eutectic temperature. The inner surface of the frame is sealed to the substrate usually by a glass seal and the outer surface of the frame has a bonded copper layer.

The enclosure about the components is completed by a cover of a non-porous insulating material, capable of withstanding the copper-oxygen eutectic temperature, which has a copper layer bonded on the inner surface in a configuration matching the copper layer on the frame. The enclosure is sealed by a solder joint attaching the copper layer on the cover to the copper layer on the frame. The construction permits one to complete the enclosure without exposing the components to a temperature too high for safety.

The enclosure may be a leadless chip carrier designed for a single integrated circuit chip, in which case a recess may be provided in the substrate for accommodating the integrated circuit chip, and closure is effected by the soldering of a copper bond on the perimeter of the recess to a copper bond on the inner surface of the cover.

The method of making the enclosure schedules the formation of the copper bonds early in the procedure, subsequent to the sintering of the ceramic, if a ceramic is employed for the part in question. A second step is the formation of the conduction runs which is also at an elevated temperature usually unsafe for IC chips. The bonding of the frame to the substrate by means of a glass seal, is also at a temperature unsafe for an IC chip. Accordingly the chip is installed only after these high temperature steps essential to a hermetic seal—impervious to moisture penetration are complete.

The IC chips are electrically connected to the conduction runs by a low temperature process, and the cover, having previously received the copper bond, is then soldered at a safe low temperature to the frame to complete the enclosure.

The invention provides an assembly, which is demountable without injury, and permits use of a transparent cover allowing optical inspection of or optical coupling with the enclosed electronics.

A BRIEF DESCRIPTION OF THE DRAWINGS

The novel and distinctive features of the invention are set forth in the claims appended to the present application. The invention itself together with further objects and advantages thereof may best be understood by reference to the following description and drawings described below:

DESCRIPTION OF THE PREFERRED EMBODIMENT

Figure 1A:
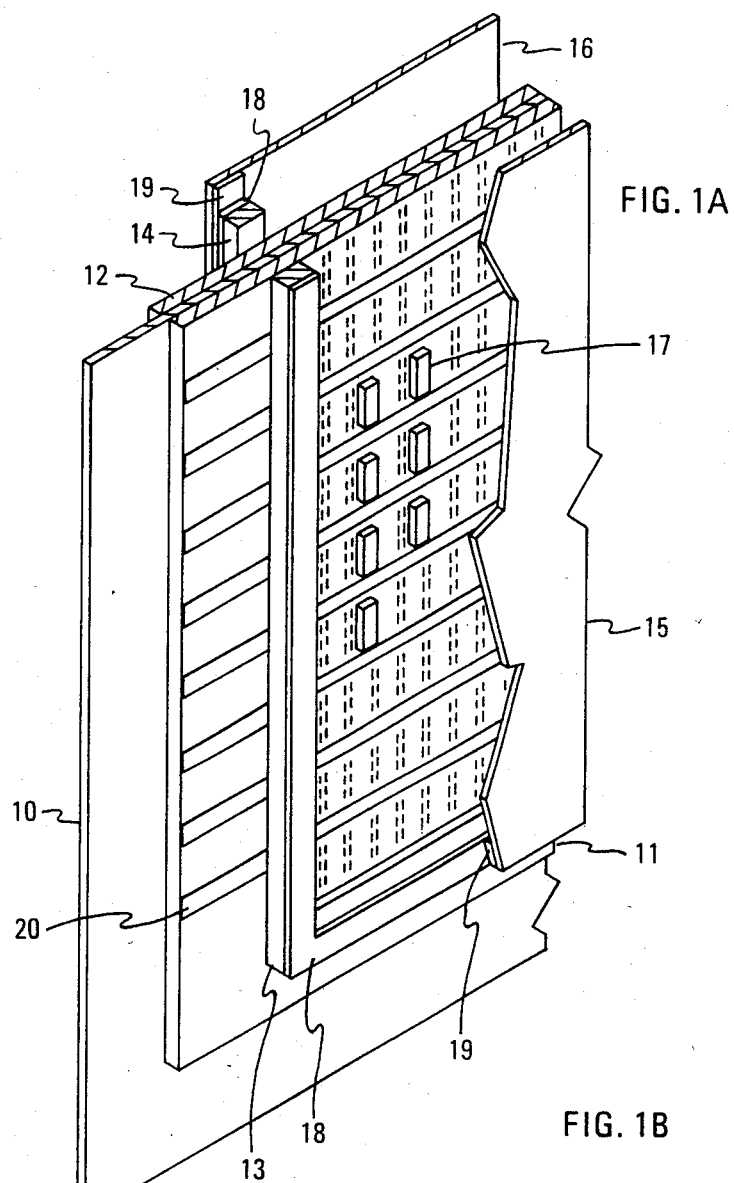
FIGS. 1A and 1B are respectively perspective and partial cross-sectional views of a novel hermetic enclosure with an optionally transparent cover for unencapsulated electronic components, such as integrated circuit chips. The enclosure is assembled from a flat substrate, a picture frame, providing room for the contained components, and a flat cover.
Figure 1B:
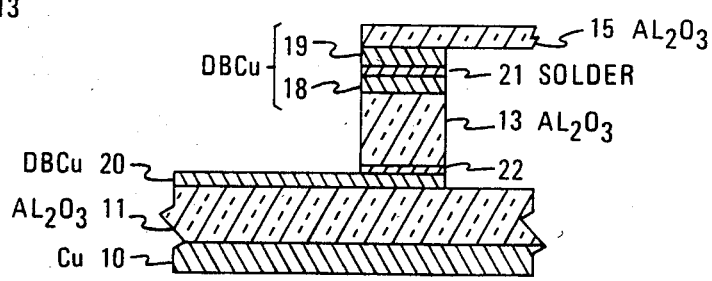

A hermetically sealed enclosure in accordance with a first embodiment of the invention is shown in FIGS. 1A and 1B. The enclosure is designed for use with a plurality of unencapsulated integrated circuit chips typically interconnected in a hybrid structure combining semiconductor chips with electrical components and providing ceramic supported conductive runs for interconnection. The chips themselves may be flipped over and connected to the conductive runs by "solder-bumps", as illustrated, or attached to the substrate uninverted, and connected to conductive pads by "flying-leads".

The enclosure is a double one consisting of a composite substrate (10, 11, 12), two frames 13, 14, respectively forming a recess on the near and far surfaces of the substrate, and the covers, 15 and 16 respectively closing these recesses. The substrate has a thermally and electrically conductive central layer 10 and two insulating surface layers (11, 12). Each surface layer supports a collection of unencapsulated integrated circuit chips, other electrical components, and interconnecting conduction runs. Some of the conduction runs continue to the outside of the finished enclosure for external connection. The two alumina frames 13, 14, which surround the sites for the integrated circuit chips, are sealed respectively to the near and far surfaces of the substrate. The covers 15, 16, which are sealed to the respective alumina frames 13, 14, complete two hermetic enclosures.

The composite substrate, in the example, consists of a central copper core 10, optionally laminated, interposed between a first alumina ($Al_2O_3$) layer 11 on the near face of the substrate and a second alumina layer 12 on the far face of the substrate. The symmetric arrangement of two outer layers of alumina applied to a single central copper core provides a construction which is thinner than competitive substrates of comparable strength and which is suitable for supporting unencapsulated ICs and sundry electronic components on both faces. The substrate may typically be from 0.025" to 0.100" thick, with a central copper core from 0.005" to 0.030" thick. The outer alumina layers are of equal thickness and normally are thicker than the copper. The alumina surfaces are high temperature resistance materials eminently suited for high temperature thick film processing and the composite construction provides the strength necessary for high shock and vibration environments. The three layer construction also provides excellent thermal conduction, which facilitates the escape of heat generated by active circuitry within the hermetic enclosure to the exterior of the package. The substrate herein described is the subject of U.S. patent application Ser. No. 595,557 filed Mar. 30, 1984, entitled A DIRECT BOND COPPER CERAMIC SUBSTRATE FOR ELECTRONIC APPLICATIONS, of Kuneman et al, and assigned to General Electric.

The rectangular alumina frame 13, similar to a picture frame in configuration, is bonded to the near face of the substrate and a corresponding rectangular alumina frame 14 is bonded to the far face of the substrate. The alumina frames are typically from 0.050" to 0.100" in height and from 0.080" to 0.100" in width, and may enclose a surface area from a fraction of a square inch to several square inches.

The alumina frames (13, 14) in cooperation with the covers (15, 16) and the substrate (10, 11, 12) are designed to provide a hermetic environment for the unencapsulated chips shown at (17), while at the same time permitting electrical connections (20) to pass from the interior of the enclosure through the hermetic seals to the exterior of the enclosure. The alumina frames are formed from a slurry, which is hot pressed to form an unsintered solid. The hot pressed alumina frames are then sintered at a temperature of about 1400° C. to increase the density and reduce the porosity. The process includes curing at lower temperatures to remove strains to form the final ceramic.

After sintering, a first face (an "outer" surface) of the frame (remote from the "inner" surface of the frame to be attached to the substrate), is electroded with a conductive copper layer 18 by the direct bond process. In the direct bond process, which is performed in a high temperature furnace with a controlled atmosphere, a copper oxide eutectic is formed on the surface of the copper to be bonded, the eutectic becoming a liquid at approximately 1063° C. The eutectic is a low melting point oxide of copper. It is formed by the provision of oxygen either in the bulk of the copper or in a copper oxide upon the surface of the copper. The formation of the eutectic usually requires an inert atmosphere designed to maintain the oxide's presence. Upon heating to a few degrees below the melting point of copper, the liquid eutectic forms on the surface of the copper, wetting that surface on the one hand, and the surface of the ceramic, where it is in contact, on the other hand. The eutectic, upon cooling to a solid, forms a "direct bond" of good thermal, electrical and mechanical properties between the copper and the alumina where the wet eutectic had bridged the gap between their adjacent surfaces.

The legend DBCu in FIG. 1B stands for "direct bond copper" which forms the eutectic.

During the bonding, the unoxidized copper remains a solid, but it is held close to its melting point for a sustained period to improve the bond. As will be described in greater detail below, sustained high processing temperatures reduce the strength of the copper so that relatively low intensity forces, such as gravity and surface tension, cause the copper layer into conformity with the adjacent surface of the substrate on which the bond is being formed.

Prior to application of the prepared frames (12, 14) to the substrate, the substrate is prepared for reception of the electrical components. A thick film conductive layer is formed upon the sintered alumina by a conventional high temperature (greater than 600° C.) process. The layer is patterned to form connection sites, and conduction runs for interconnecting the ICs, electrical components and external contacts. The thick film conduction runs are thus required to be present both within the region on the alumina to be enclosed by the rectangular frame, and to pass to the outside of the frames, where they must be available for external connection. The substrate, with thick film pads and conduction runs in place, but without the ICs and electrical components attached, is now ready for a sealed attachment of the alumina frames.

The second face or "inner surface" of the alumina frames 13, 14 are now sealed to the surfaces of the substrate. Preferably the frames are attached to the substrate by a moderate temperature process, using either a low melting point glass frit or an insulating solder glass. The temperature (400° C.–500° C.) of this glass seal is below the temperature (1063° C.) at which a direct bond is formed between the copper and the alumina and does not affect the direct copper bond; and is well above the temperature required for any subsequent bonding or soldering. The glass seal withstands the temperatures associated with diebonding, bonding or low temperature soldering, which are selected to be safe for processing semiconductors. The glass seal is not adversely affected by subsequent processing.

The substrate, with frames 13, 14 hermetically sealed about the conductor runs on the surfaces of the substrate, is now ready for attachment of the integrated circuit chips and the electrical components. Attachment of these parts at this stage in the assembly, avoids exposure of these parts to the earlier high (400°–500° C.) temperatures required for the glass seal.

The integrated circuit chips and electrical components are next attached to the substrate by one of three processes using a temperature which is sufficiently low to avoid component damage; a gold alloy eutectic bond which is slightly in excess of 300° C.; soldering which is between 200° and 300° C; or epoxy bond which is usually under 150° C. After bonding of the IC to the substrate, the substrate is now ready for attachment of the covers 15, 16.

The covers 15, 16, with the frames 13, 14 are configured to complete the desired hermetic enclosure about the unencapsulated electrical components. In a multiple chip, hybrid assembly as illustrated in FIG. 1, the substrate is preferably flat (and not recessed) and the frames and covers together provide a recess with the headroom required for the attached components. Since the frame provides the headroom, the cover can be flat, and as will be seen, this is a convenient choice. The thickness of the cover is typically between 0.015" and 0.060", the thickness being smaller, when the area of the cover is smaller.

The covers are of a high temperature resistant, insulating material, typically alumina, beryllia, quartz ($SiO_2$) or sapphire ($Al_2O_3$), each having on their under surfaces a layer of direct bond copper configured to match the copper layer on the outer surfaces of the frames. Typically the cover is approximately the same size as the frame, with the direct bond layer 19 continuing around the perimeter on the inner surface of the covers.

The covers are formed and the direct copper bond applied, preliminary to assembling the covers upon the substrate. If a ceramic material is used for the covers, the frit is hot pressed, and fired at the sintering temperature to increase the density and remove the porosity. Quartz, whether fused or monocrystalline, and sapphire are suitable for application of a copper bond. The copper layer is formed on the cover under the same conditions used to form the bond on the frames. The cover with the bonded copper layer on the under surface is now ready for solder assembly to the frame on the substrate.

Final closure of the package about the components is achieved by a low temperature soldering process designed to avoid injury to the components. The soldering process is usually performed with both the top surface of the frame and the undersurface of the cover pre-soldered. Then the cover and substrate assembly are set up for soldering in a nitrogen atmosphere, which fills the interior of the package as it is being sealed and the two pre-soldered surfaces are soldered together. The unencapsulated components are now enclosed in a passivating atmosphere of nitrogen.

The final closure by soldering, as stated above, is at a temperature which the electronic components can easily withstand, and the soldering temperature is well below the temperature that could adversely affect any of the finished electronics.

Viewing the assembly more generally, the process of assembling the enclosure follows the rule that each step in processing an assembly or subassembly takes place at a lower temperature than the prior step. The practice avoids thermal injury to the previously formed structures.

While the objective has been to encapsulate low temperature electronic components in a high reliability package assembled using processes that require high temperature processing steps (i.e. thick film conduction runs), the objective of accomplishing a low temperature closure not harmful to the electronic components has been achieved by adding a high temperature step (i.e. the direct bond copper step) which permits a low temperature final closure (i.e. low temperature soldering).

The enclosure is particularly advantageous for optically coupled electronics, where the cover may be one of the transparent materials mentioned earlier. Optical coupling may be used for control or signal paths through the transparent cover to the enclosed electronics.

The direct copper bond must, however, be carefully formed to insure reliability of the seal. Preferably the direct bond copper layer is formed using a 1–10 mil thickness of copper. Touch pitch copper (TPCU), OFHC copper or silver bearing copper are suitable. The cover thickness, typically 3 mils, may lie in the range of from 1–10 mils. The direct bond is formed in a long oven (Tempress BTU) typically in a six zone furnace of from 14 to 17 feet long. The belt speed is 2" per minute, giving a processing time of approximately two hours. The oven has entrance and exit curtains to maintain an atmosphere of the desired composition. Preferably the atmosphere is nitrogen controlled to less than 40 parts per million of $O_2$.

The eutectic temperature (1063° C.) is maintained in the fourth zone of the oven, while the third and fifth zones are maintained at 1050° C. The first and sixth zones are kept at 900° C., and the second zone at 1020° C. The process allows 20" of travel at temperatures in excess of 1040° C. to allow the copper to collapse into conformity with the supporting surfaces. The bond is accordingly substantially blister free, and provides a reliable hermetic seal over flat surfaces (or surfaces with simple curves).

The package may be formed in one of several systems depending upon cost and application. Where optical coupling is desired a transparent quartz or sapphire cover may be employed. The substrate and frames may be of alumina or beryllia. Where optical coupling is not desired, the lowest cost package is one in which the substrate material, frame and cover are all of alumina. An all beryllia construction is also practical, but somewhat more costly.

Figure 2:
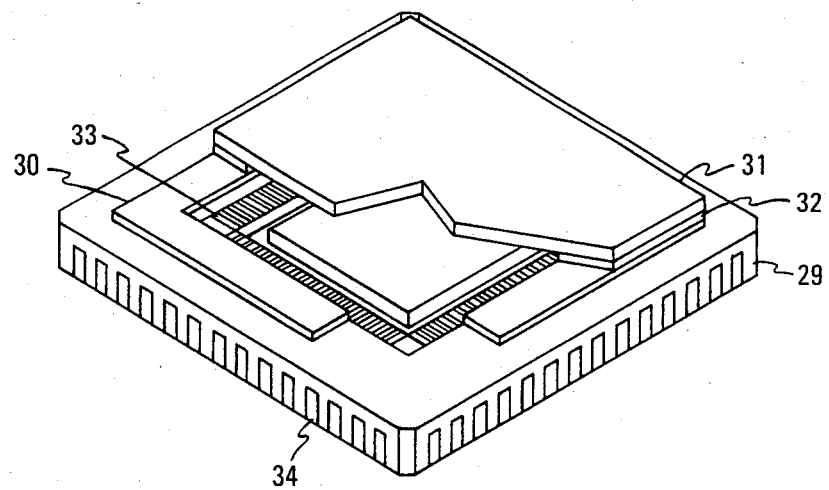
FIG. 2 is a perspective view of an alternative hermetic enclosure for a single integrated circuit, in which the enclosure is assembled from a recessed substrate of laminar construction provided with a flat cover.

A hermetically sealed enclosure in accordance with a second embodiment of the invention is illustrated in FIG. 2. The invention is applied to a leadless chip carrier having a recessed substrate 29. The substrate is typically of alumina or beryllia. The recess is provided to accept a single large scale integrated circuit chip and a shelf is provided in the recess for supporting conduction runs 33 for connection by flying leads (not shown) to the chip. The undersurface of the recess is provided with a conductive layer to which the undersurface of the chip is attached by one of three low temperature processes earlier noted. The conductive runs 33 are in turn connected to the external terminals 34 which surround the chip carrier and which are used for connection of the chip carrier to conduction runs on a larger substrate.

In accordance with the invention, the perimeter of the recess, on the upper surface of the substrate is provided with a bonded copper layer 30 which cooperates with a bonded copper layer 32 of matching configuration on the under surface of the cover 31 to provide two solderable surfaces for low temperature closure of a hermetic seal about the integrated circuit chip. The cover, where transparency is sought, is of fused quartz or sapphire, and where transparency is unnecessary, is of alumina or beryllia.

The recessed substrate is of a multilayer structure employing three ceramic layers. A lowermost ceramic layer is used to form the bottom of the recess and to support the conductive layer to which the under surface of the chip is attached. The ceramic layer next above provides a shelf for support of the conduction runs 33 to which flying leads bonded to the chip are attached and which make connections to the leadless terminals 34 on the perimeter of the carrier. The wire bonding of the flying leads to pads on the chip may be performed in one of three relatively low temperature (less than 200° C.) processes. The processes include thermal compression bonding, ultra sonic bonding, or thermo sonic bonding. A third layer of ceramic provides the surface upon which the bonded copper layer 30 is formed.

The order of assembly of the FIG. 2 enclosure is similar to that employed in the assembly of the first embodiment and enclosed electronic components are exposed only to the low temperatures that the electronic components can withstand. In detail, the uppermost layer of the substrate is sintered and the copper layer 30 is bonded thereto prior to attachment to any ceramic layers underneath. The conduction runs and the ground planes on the under layers are formed next. When these steps are completed, the layers are sealed together (typically with a glass seal) to form an integral structure lacking only the cover 31 but not yet containing the chip. As final steps in assembly, the bottom of the integrated circuit chip is attached to the substrate; the flying leads are bonded to the pads on the chip and to the conduction runs; and the cover 31 is sealed to the substrate by a soldering step which bonds the copper layer 32 on the cover to the copper layer 30 on the substrate to complete the seal.

The completed enclosures, herein described, are highly reliable hermetic seals in which the barrier posed to the exterior, entails a sintered ceramic, a direct copper bond, solder, and glass. While a low temperature organic material may be used within the enclosure, as for instance, a conductive epoxy may be used to attach the chip to the substrate, no organic material is used in completing the hermetic seal. Accordingly, the problems of moisture penetration present in epoxy encapsulation are not present, and the seal is a very low leakage hermetic seal.

The completed enclosures may be reopened in the event of specific component failure for diagnostic or repair purposes. The opening of a solder seal is not injurious to the enclosed electronics, nor does it pose problems in resealing.

The process is applicable to enclosures in which the cover may be of a transparent material. The usefulness of this feature is in its permitting visual inspection of the enclosed electronics, and optical signalling through the cover. The signalling may be of low bandwidth for control purposes, or programming, or of a high bandwidth for signal processing. Practical transparent cover materials have been of quartz, usually fused, garnet, and sapphire. These transparent insulating materials form excellent bonds with the copper eutectic, which by use of a solder seal are readily demountable for servicing the enclosed electronics. In addition, the transparent package is esthetically more attractive.

The enclosures herein described with transparent and non-transparent covers are readily applied to much larger sizes than single chip carriers. While single chip carriers are available in sizes under $\frac{3}{8}'' \times \frac{3}{8}''$, the enclosure herein described may be used in chip carriers that small, but they may also be used in much larger enclosures for a plurality of chips as suggested in FIGS. 1A and 1B. The upper size limits are results dictated primarily by need rather than by internal limitations in the approach. Sizes of $2'' \times 2''$, $2'' \times 4''$, or $5'' \times 8''$ and larger sizes all seem equally practical of execution when the need arises.

The direct bond approach has a small initial cost advantage over the conventional moly-manganese attachment, and this cost advantage increases rapidly as the size of the enclosure increases. In the larger sizes the cost of the conventional moly manganese technique tends to accelerate rapidly and to become too costly to be practical. In the larger sizes, the increase in cost for a direct bond copper approach is still proportional to size (without cost acceleration).

What is claimed is:
1. A hermetic enclosure permitting safe low temperature enclosure of electronic components comprising:
   A. a substrate for supporting one or more electronic components having a layer of non-porous insulating material capable of withstanding thick film processing and glass sealing temperatures;
   B. a frame for surrounding substrate-supported electronic components, of a non-porous insulating material capable of withstanding the copper-oxygen eutectic temperature, having its under surface sealed to said substrate and a copper layer bonded on its upper surface;

C. a cover for completing the enclosure of said substrate-supported electronic components, of a non-porous insulating material capable of withstanding the copper-oxygen eutectic temperature, and having a copper layer bonded thereto in a configuration matching said layer on said frame; and D. a solder joint attaching said copper layer on said cover to said copper layer on said frame to permit completion of said enclosure at a low temperature safe for said components.

2. The enclosure set forth in claim 1 wherein:

said frame is sealed to said substrate layer by a glass seal.

3. The enclosure set forth in claim 1 wherein;

conduction runs are applied by a thick film process over said substrate layer for a safe low temperature connection to said electronic components, said frame being sealed to said substrate over said conduction runs, and to exposed portions of said substrate layer by a glass seal.

4. The enclosure set forth in claim 3 wherein;

the composition of said substrate layer is alumina ($Al_2O_3$), beryllia ($Be\ 0$), or aluminum nitride ($Al\ N$).

5. The enclosure set forth in claim 3 wherein;

said cover is of a transparent material.

6. The enclosure set forth in claim 3 wherein;

said material of said cover is silicon oxide ($Si\ O_2$) or aluminum oxide ($Al_2O_3$).

7. The enclosure set forth in claim 3 wherein;

said substrate layer, said frame, and said cover are alumina.

8. The enclosure set forth in claim 3 wherein;

the material of said cover is alumina, beryllia, quartz or sapphire.

9. A method of hermetically enclosing electronic components at safe low temperatures comprising the steps of:

A. (1) providing a substrate for supporting one or more electronic components comprising a layer of high temperature insulating material suitable for providing thick film conduction runs, and (2) providing said conduction runs on said layer for subsequent connection to the terminals of said components by a low temperature connection process safe for said components;

B. (1) providing a frame for surrounding substrate-supported electronic components, said frame being of a non-porous insulating material capable of withstanding the copper-oxygen eutectic temperature, said frame having a copper layer bonded to its outer surface, and (2) attaching said frame by its inner surface to said conduction runs and the exposed surfaces of said substrate layer;

C. placing said components on said substrate within said frame, and connecting the terminals thereof to said conduction runs by a safe low temperature process; and D. (1) providing a cover for completing the enclosure of said substrate-supported electronic components of a high temperature insulating material capable of withstanding the copper-oxygen eutectic temperature, having a copper layer bonded thereto having a configuration matched to the upper surface of said frame, and (2) soldering said copper layer on said cover to said copper layer on said frame to complete the enclosure of said components at a low temperature safe for said components.

10. A hermetic enclosure permitting safe low temperature enclosure of electronic components comprising:

A. a recessed substrate for enclosing one or more electronic components and supporting conductive runs, including runs accessible outside said recess, permitting safe low temperature electrical connection to enclosed electronic components;

said substrate being of a non-porous insulating material, capable of withstanding the copper-oxide eutectic temperature, and a copper layer bonded on the perimeter of said recess;

B. a cover for closing said recess of a non-porous insulating material capable of withstanding the copper-oxygen eutectic temperature having a copper layer bonded thereto in a configuration matching said layer on said perimeter; and C. a solder joint attaching said copper layer on said cover to said copper layer on said substrate to permit completion of said enclosure at a low temperature safe for said components.

11. The enclosure set forth in claim 10 wherein;

said cover is of a transparent material.

12. The enclosure set forth in claim 11 wherein the composition of said cover is silicon oxide ($Si\ O_2$) or aluminum oxide ($Al_2O_3$).

* * * * *